United States Patent [19]

Miersch et al.

[11] Patent Number: 5,122,439
[45] Date of Patent: Jun. 16, 1992

[54] FORMING A PATTERN ON A SUBSTRATE

[75] Inventors: Ekkehard F. Miersch, Rye; Jae M. Park, Binghamton, both of N.Y.

[73] Assignee: International Business Machines Corp., Armonk, N.Y.

[21] Appl. No.: 399,058

[22] Filed: Aug. 28, 1989

[51] Int. Cl.⁵ ................................................. G03C 5/00
[52] U.S. Cl. ..................................... 430/311; 430/313; 430/314; 430/319; 430/323
[58] Field of Search ............... 430/314, 319, 311, 313, 430/323

[56] References Cited

U.S. PATENT DOCUMENTS

| | | | |
|---|---|---|---|
| 3,659,510 | 5/1972 | Garvin et al. | 430/23 |
| 3,791,858 | 2/1974 | McPherson et al. | 430/314 |
| 4,272,612 | 6/1981 | Oliver | 430/323 |
| 4,289,381 | 9/1981 | Garvin et al. | 156/643 |
| 4,576,900 | 3/1986 | Chiang | 430/313 |
| 4,585,519 | 4/1986 | Jaffe et al. | 156/645 |
| 4,629,681 | 12/1986 | Takada et al. | 430/314 |
| 4,861,420 | 8/1989 | Knutti et al. | 437/249 |
| 4,918,032 | 4/1990 | Jain et al. | 437/228 |

Primary Examiner—Charles L. Bowers, Jr.
Assistant Examiner—Thomas R. Neville
Attorney, Agent, or Firm—Pollock, Vande Sande & Priddy

[57] ABSTRACT

A pattern is formed on a substrate by providing on the substrate a dielectric composition; defining a pattern in said dielectric; depositing metal and then micromachining the metal to provide the desired pattern on the substrate.

24 Claims, No Drawings

FORMING A PATTERN ON A SUBSTRATE

TECHNICAL FIELD

The present invention is concerned with forming a pattern on a substrate. In particular, the present invention is concerned with the formation of a metallic pattern on a substrate. The present invention is especially useful for the fabrication of thin film structures for multichip packaging. The processes of the present invention make it possible to eliminate a number of process steps employed in prior processes thereby resulting in significant cost reduction and improved yield. According to the present invention, micromachining such as micromilling to remove metal in undesired areas is employed.

BACKGROUND ART

Methods suggested for fabricating thin film wiring on a substrate typically involve a number of expensive and time consuming steps. A particular example of such for circuit definition involves reactive ion etching, e.g. oxygen or combination of oxygen and fluorocarbon such as carbon tetrafluoride, through relatively thick lift-off stencil such as soluble polyamide and dielectric (e.g.—PMDA—ODA polyimide) layers.

After the reactive ion etching, backfilling with the desired metals is carried out.

This backfilling is currently done by building up individually the single circuit pattern (lines and vias) either in lift-off structures or by plating.

However, prior to the reactive ion etching, it is necessary to render the circuit pattern resistant to the reactive ion etching. Such methods include chemical silylation and preferably the use of inherent etch resistant materials, e.g. polymers containing inorganic components or inorganic materials.

After the backfilling with the metal, the lift-off mask (e.g.—soluble polyimide) is removed by dissolution in a suitable solvent. Removal of the mask in turn removes, or lifts off with it, the metal film above the mask on the undesired areas to leave the metal circuit pattern on the substrate.

The above sequence of steps; however, suffers from some deficiencies. For instance, the etch rate for reactive ion etching is not especially uniform over a relatively large substrate required for a multichip module.

The nonuniformity of the etch rate can result in variations in the dielectric thickness, which in turn, can cause deterioration in the electrical performance of a device. To overcome nonuniformity in etch rate, etch stop layers can be employed beneath the dielectric layer. The etchstop layer allows over-etching which will lead to uniform depth in the etched channels. However, the etchstop materials suggested are somewhat wanting in one or more of the properties desired. For instance, the etchstop should be resistant to the etching process, exhibit good adhesion to the dielectric and material beneath the etchstop, have high thermal stability and a thermal coefficient of expansion that closely matches that of the other layers of the structure.

In addition, lift-off processes employed can require relatively long soaking times (e.g.—several hours) in the lift-off solvent. This long soaking can result in diffusion of the solvent into the dielectric which in turn causes increase in stress that can lead to delamination of the metal layers from the dielectric.

SUMMARY OF INVENTION

In accordance with the present invention, the lift-off process employed in prior art processes is eliminated. In addition, the present invention makes it possible to eliminate, if it is desired to do so, dielectric removal techniques such as reactive ion etching or laser ablation and the ablation related stop techniques such as stop layers or larger metal lands for vias.

However, the present invention can be practiced, if desired, employing reactive ion etching. For example, the present invention, because of the ability to eliminate the lift-off procedure makes it possible to achieve significantly improved yields as well as reducing cost even when ablation techniques are desired for other reasons.

In particular, the present invention is concerned with the fabrication of a metallic pattern on a substrate. According to one aspect of the present invention, a dielectric layer is provided on a substrate. The desired pattern of circuit channels is defined in the dielectric layer. Metal is deposited onto the dielectric layer and in the circuit channels. The metal is removed from above the dielectric and is left remaining in the circuit channels by micromachining.

Multilayer structures can be built by repeating these process steps.

According to another aspect of the present invention, a photoresist is provided on a substrate and the desired pattern of circuit channels is defined in the photoresist. Metal is deposited onto the photoresist and in the circuit channels. The metal is micromachined down to the level of the photoresist. The photoresist is then removed. A dielectric layer is deposited over the substrate and metal. The dielectric layer is then micromachined down to the level of the metal thereby providing the metallic pattern with dielectric therebetween. Multilayer structures can be built by repeating these process steps.

According to another aspect of the present invention, a metal layer is provided on a substrate, and micromachined down to the desired layer thickness.

A photoresist is then deposited on the metal and the desired pattern of circuit channels is defined in the photoresist. The desired metallic pattern is etched in the metal layer using the photoresist as the mask. The photoresist is then removed. A dielectric layer is deposited over the substrate and metallic pattern. The dielectric is then micromachined to the level of the metal to achieve the same result as described above.

BEST AND VARIOUS MODES FOR CARRYING OUT INVENTION

The present invention, according to one aspect of the present invention, involves providing a layer of dielectric onto a substrate. Typical substrates include metals, plastics, ceramics, glass, glass-ceramics and ceramics already having circuitry thereon.

The dielectric layer employed, according to one aspect of the present invention, can be any photosensitive material that is patternable by exposure to actinic light such as ultraviolet light, x-rays, electron-beams and ion beams. The materials can be positive or negative resist.

The preferred photosensitive materials employed are the photosensitive polyimide compositions and photosensitive epoxy polymer compositions.

Such compositions include the polymer or polymer precursor and a compound having a photosensitive group. For example, photosensitive polyimide precursor compositions are known, as exemplified by U.S. Pat. No. 4,243,743 to Hiramoto, et al., U.S. Pat. No. 4,547,455 to Hiramoto, et al., U.S Pat. Nos. 4,093,461 and 4,395,482.

The photosensitive polyimide precursor used can be given the sensitivity to the actinic radiation such as ultraviolet rays, far ultraviolet rays, and visible rays by introducing an organic photosensitive group into the polyimide precursor, for instance the side chain thereof, or by mixing a photosensitive compound with the polyimide precursor. Such photosensitive polyimide precursors are known in the art.

The photosensitive group includes those which are dimerized or polymerized by the light to form crosslinkages between the polyimide precursors, those which are activated to radicals or ions by the light, by which radicals or ions the polyimide precursors being crosslinked therebetween, and those which are activated by the light and reacted with the polyimide precursors to reduce the solubility thereof. As such a photosensitive group, a group having carbon-carbon double bond which is dimerizable or polymerizable by the light, an azide group and a quinone diazide group are exemplified.

The photosensitive compound which can be mixed with the polyimide precursor has the photosensitive group mentioned above. As such as photosensitive compound, vinyl compounds having an amino group, bis-azide compounds and naphthoquinone diazide compounds are exemplified.

The following are typical examples of the photosensitive polyimide precursor.

(i) A mixture of a polyimide precursor represented by the formula (II) and a compound having the photosensitive group and amino group;

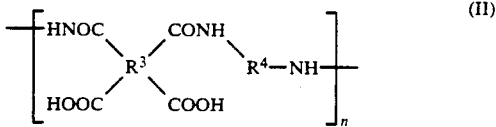

(II)

wherein n is an integer and $R_3$ and $R_4$ are tetravalent and bivalent aromatic group, respectively.

The photosensitive group herein mentioned is the same as defined above. Examples of compounds having the photosensitive group and amino group are, allylamine, vinylpyridine, dimethylaminoethyl methacrylate, diethylaminoethyl methacrylate, dimethylaminoethyl acrylate, diethylaminoethyl acrylate, diallylamine, compounds having an azide group and amino group, and compounds having diazide group and amino group.

The group $R_3$ in the formula (II) includes, for instance, a phenyl, benzophenonyl, naphthyl, and biphenyl group. The group $R_4$ includes, for instance, phenoxyphenyl, phenylsulfonylphenyl, benzylphenyl, and phenyl group.

(ii) A polyimide precursor represented by the formula (III);

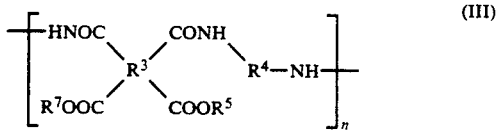

(III)

wherein $R^3$, $R^4$, and n are defined as above, respectively, and $R^5$ is an organic group having a functional group dimerizable or polymerizable by the light.

The group $R^5$ includes, for instance, allyl group, methallyl group, and various acyloylalkylenyl groups represented by the following formulas:

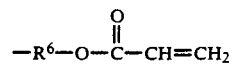

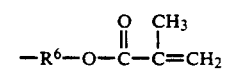

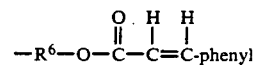

wherein $R^6$ is bivalent alkylene group of 2 or 3 carbon atoms.

(iii) A polyimide precursor represented by the formula (IV);

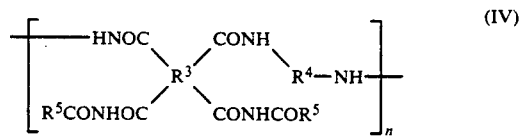

(IV)

wherein $R^3$, $R^4$, $R^5$, and n are defined as above, respectively.

(iv) A mixture of the polyimide precursor represented by the formula (II) and bis-azide.

(v) A mixture of the polyimide precursor represented by the formula (II) and naphthoquinone diazide.

The photosensitive layer may contain one or more photosensitizers such as Michler's ketone, benzoin ether, 2-t-butyl-9,10-anthraquinone, 4,4'-bis(diethylamino)benzophenone, bis-azide compound, monoazide compound, and sulfonazide compound. Further, the photosensitive polyimide precursor may contain a comonomer which is copolymerizable to the polyimide or the precursor thereof.

The photosensitive polyimide precursor compositions are usually applied to the substrate in a form of a solution.

Conventional solvents include N-methyl-2-pyrrolidone, N,N-dimethylacetamide, α-butyrolactone, N,N-dimethylformamide, and preferably N-methyl-2-pyrrolidone.

Some commercially available solutions of photosensitive polyimide precursor compositions are Probimide ™ 348 Photoimageable Polyimide available from Ciba-Geigy Corporation; PI-2701D Photosensitive Polyimide, available from E. I. DuPont de Nemours and Company, Inc.; Selectilux ® HTR3 Polyimide Precursor Photoresist, available from E. M. Industries, Inc.; PL-1100 Photoreactive Polyimide Precursor, available from Hitachi Chemical Company, Ltd.; Timel 6246 A Photosensitive Polyimide Precursor available from Asahi Chemical Company; and Photoneece UR-3640 Photosensitive Polyimide Precursor, available from Toray Industries, Inc.

Photosensitive polyepoxy compositions are known as exemplified by U.S. Pat. Nos. 4,169,732, and 4,237,216 and U.S. patent application Ser. No. 07/062,360 disclosures of which are incorporated herein by reference. The epoxy compositions disclosed in U.S. patent application Ser. No. 07/062,360 to Gelorme, et al., disclosure of which is incorporated herein by reference, exhibit improved resolution in relatively thick layers (e.g.—1 mil line in 1 mil thickness). For instance, many of the commercially available polyimides should not be thicker than about 0.4 mils after final curing.

An example of an epoxy composition prepared pursuant to U.S. Ser. No. 07/062,360 can contain 76.1 weight % of SU-8, an octafunctional epoxidized novalac from Celanese Resins, 16.6 weight % of CY179, a cycloaliphatic epoxide available from Ciba-Geigy. 2.0 weight % of UVE 1014, a triarylsulphonium salt (50% solution) available from General Electric, 0.5% FC430 surfactant and 4.9 weight % of XD7342, an epoxidized trishydroxyphenyl-methane available from Dow Chemical Co.

Fine line definitions in a thick dielectric layer is particularly important when a narrow and tall circuit pattern is desired for low line resistance. Also a thick dielectric layer is necessary for the fabrication of so-called fat-line structures (1 mil lines). The fat-line structures are particularly useful for a high performance packaging of high DC current devices such as ECL circuits.

The photosensitive composition is coated onto the desired substrate by any known method including spinning spraying, or roller coating.

When used as the insulator between two layers of metallization, the final thickness is usually about 2 to about 50 and preferably about 6 to about 15 micrometers.

The layer of the photosensitive polyimide precursor is then prebaked in order to remove the solvent and dry the coating. The most common solvents employed for polyimide precursor are N-methyl-2-pyrrolidone and butyrolactone.

Typically, the prebaking is carried out at temperatures of about 50° to 150° C. for about 15° to about 60 minutes.

After the prebaking, the layer is exposed imagewise to actinic radiation through a photomask to form an exposed image pattern of photoresist in the layer. The actinic radiation can, for example, be provided by employing mercury lamp using G-line of 436 nanometers or the I-line of 365 nanometers (wavelength of light) and exposure energy of about 150 millijoules/cm$^2$ to about 650 millijoules/cm$^2$ measured at the wavelength of irradiation.

After the exposure through a photomask, the mask is removed and the exposed photosensitive layer is developed.

Examples of photomasks include chromium mask bearing an image pattern of chromium or chromium oxide on a glass or an emulsion mask bearing the image pattern of photographic emulsion on the glass or a transparent film.

Suitable developing solvents for the polyimides are N-methyl-2-pyrrolidone and γ-butyrolactone with additives such as xylene and alcohols. Suitable developing solvents for the epoxy photoresists of U.S. Pat. No. application Ser. No. 07/062,360 are trichloroethane, 1,1 1-trichloromethane, diglyme, propylene glycol and monomethyl ether acetate.

The temperature of the developing is usually from about 20° C. to about 30° C.

The patterned layer thereby obtained is then postbaked to the desired level of curing. It is preferred when an additional subsequent layer of dielectric is to be employed that the curing be partial in order to enhance adhesion to the subsequent dielectric layer. The degree of curing referred to as B-curing is controlled by temperature and dwell time. B-curing is typically carried out at temperatures of about 250° C. to about 380° C. and preferably about 300° C. to about 350° C. for about 10° to about 60 minutes and preferably about 20 to about 40 minutes.

If desired, instead of a photosensitive dielectric, a more conventional non-photosensitive dielectric can be use as the dielectric including polyimides or epoxy polymer compositions. For instance, the more conventional non-photosensitive polyimides that can be employed include unmodified polyimides, as well as modified polyimides such as polyester imides, polyamide-imide-esters, polyamide-imides, polysiloxane-imides, as well as other mixed polyimides or mixtures of polyimides.

Such are well-known in the prior art and need not be described in any great detail.

Generally, the polyimides include the following recurring unit:

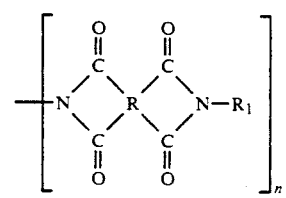

wherein n is an integer representing the number of repeating units to provide a molecular weight usually about 10,000° to about 100,000. R is at least one tetravalent organic radical selected from the group consisting of:

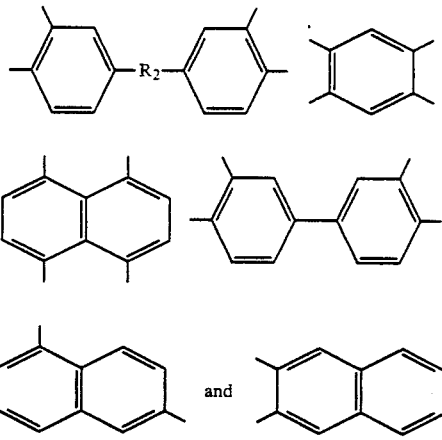

R$_2$ being selected from the group consisting of divalent aliphatic hydrocarbon radicals having from 1 to 4 carbon atoms and carbonyl, oxy, sulfo, hexafluoroisopropylidene and sulfonyl radicals and in which R$_1$ is at least one divalent radical selected from the group consisting of:

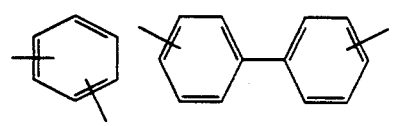

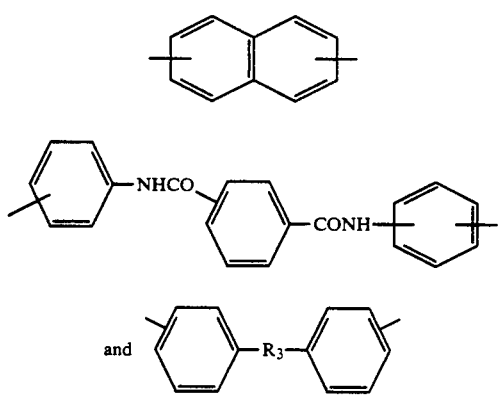

in which $R_3$ is a divalent organic radical selected from the group consisting of $R_2$, silico, and amino radicals. Polymers containing two or more of the R and/or $R_1$ radicals, especially multiple series of $R_1$ containing amido radicals, can be used.

According to the aspect of the present invention to pattern a dielectric non-photosensitive, polyimide precursors (polyamic acid or ester) can be used. Such are commercially available from a number of vendors.

Typical commercially available polyimide precursors are various polyimide precursors from Du Pont and available under the trade designation Pyralin ®. This polyimide precursor comes in many grades, including those available Pyralin ® polyimide precursors from Du Pont under the further trade designations PI-2555 ®, PI-2545 ®, PI-2560 ®, PI-5878 ®, PIH-61454 ®, and PI-2540 ®. The polyimide precursor is coated onto the desired substrate by any known method including spinning or spraying. The layer of the polyimide precursor is then baked in order to remove the solvent. Typically, the baking is carried out at temperatures of about 80° to 120° C. for about 15° to about 60 minutes.

Baking out of the solvent of the polyimide layer is called A-curing and is done in order to optimize the etchability and mechanical properties of the film.

Next, a pattern is etched in the polyimide to provide the desired pattern of circuit channels. The etching can be accomplished by employing well-known photoresist and photolithographic processing.

In the case of positive resist, a developer, usually an alkaline solution, can be used for etching the polyimide acid layer as well as developing the resist.

The positive resist is coated onto the desired substrate by any known method including spinning or spraying. A positive resist typically about 2 to 12 micron thick.

A typical positive photoresist being TNS, which is a toluene diisocyanate novalak polymer sensitized with tricyclodecane diazonapthaquinone [i.e.—bis-4,8-(hydroxymethyl)tricyclo(5.2.1.0 2,6)decane-o,o-bis(6-diazo-5,6-dihydro-5-oxo-1naphthalene) sulfonate].

The photoresist is then exposed to actinic light such as ultraviolet light radiation in the desired pattern and then developed by employing a suitable solvent to remove the exposed photoresist. A typical developer being tetramethylammonium hydroxide which will also etch the A-cured polyimide to provide the desired circuit channel pattern therein.

After the polyimide is etched to provide the desired pattern, the remaining photoresist is then stripped. A suitable solvent for the TNS positive resist is n-butyl acetate and/or isopropyl alcohol.

Other examples of positive photoresists that can be employed include positive photoresists of the type based on phenol formaldehyde novalak polymers. A particular example of such is Shipley AZ 1350 which is an m-cresol formaldehyde novalak polymer composition, which includes therein a diazoketone, such as 2-diazo-1-naphthol-5-sulphonic acid ester. The composition usually contains about 15% or so by weight of the diazoketone compound. In addition, in other systems, the diazoketone is actually attached directly to the polymer molecules. A discussion of photoresist materials can be found, for instance, in Journal of the Electrochemical Society, Vol. 125, No. 3, Mar. 1980-Deckert, et al., "Microlithography-Key to Solid-State Fabrication", pp. 45C-56C, disclosure of which is incorporated herein by reference.

According to the present invention the function of the photoresist can be supported by a thin metal layer as an additional etch mask between the photoresist and the A-cured or dried polyimide. This requires two etchants, and eventually a third etchant, allows the use of the more aggressive polyimide etchants with smaller yield risk as more aggressive etchants tend to damage the photoresist. The thin metal layer is usually about 500 to about 5000 angstroms thick.

For example, in the event the polyimide is more fully cured at this state, it will be necessary to use a more aggressive developer to patter the polyimide. An example of a typical aggressive developing composition is an aqueous potassium hydroxide solution.

Instead of employing positive photoresists, negative photoresists can be used if desired. In that event, since most negative photoresists require an organic developer and since such will not etch the polyimide layers, two different etchants will be necessary for the processing.

A typical available negative photoresist is Kodak KTFR ®, which, according to the manufacturer, is based upon resin systems that contain derivatives of polyisoprene rubber (Levine, et al., Kodak Photoresist Semin. Proc., Vol. 1, pp. 15-17, 1968, Kodak Publ. p. 192 A). Another typical negative photoresist is Armstrong Fanton F362 which according to analysis thereof contains a styrenemaleic ester copolymer containing a diacrylate and Irgacure 907, which is isopropyl thioxanthene from Ciba-Geigy.

The photoresist can be developed by employing a methylchloroform spray followed by rinsing using a water spray rinse or freon.

The negative KTFR ® photoresist can then be stripped employing J-100 stripper which contains about 35% by volume of perchloroethylene, about 35% by volume of orthodichlorobenzene, about 10% by volume of phenol, and about 20% by volume of alkylaryl sulfonic acid.

After removal of the remaining photoresist, the polyimide can be further cured such as heating to about 350° C. for about 60 minutes.

Although the preferred via and circuit patterning methods in a dielectric layer are the uses of photosensitive dielectric or wet etching methods, it is also possible to use ablation techniques for patterning the dielectrics. As example for an ablation technique, reactive ion etching is chosen because it is very useful when extremely small features are required, e.g. 1-2 microns or less, where the use of photosensitive dielectric or wet etching is of limited feasibility.

Typically a dielectric layer, preferably non-photosensitive polyimide, is deposited on aa substrate preferably metal ceramic or silicon wafer. The polyimide layer is processed as described above to complete the curing.

A layer that is resistant to reactive ion etching, e.g. metals or metal oxides, or a photoresist which can be processed to incorporate an etch resistant, e.g. silicon containing small molecules, is deposited on the polyimide layer. The etch resistant layer protects from etching those areas where a circuit pattern is not desired. The etch resistant layer is usually about 500 to about 5000 angstroms thick. When a photoresist is used, the photoresist is photolithographically processed to define a circuit pattern as described above followed by treatment with typical silylating agents.

In the case of using a metal film for an etch resistant layer, the layer is usually deposited by a vacuum deposition technique such as evaporation or sputtering up to several thousand angstroms.

Any high resolution photoresist such as Shipley AZ1350 is coated by typically spin coating. After the circuit pattern is photolithographically defined in the resist, the resist is dried, developed and baked. Then the metal layer is etched with an appropriate etchant followed by a resist strip. The patterned metallic layer serves as a reactive ion etching mask.

The polyimide and patterned metal structure is then etched by oxygen reactive ion etching by using typically, combinations of oxygen and fluorocarbon gases.

After the polyimide layer is patterned, the etch resistant layer is removed by etching in the case of metallic layer or fluorine rich reactive ion etching in the case of silylated resist layers.

After the pattern of the circuit channels in the dielectric have been provided whether a photosensitive or non-photosensitive dielectric is used, according to the present invention, the entire patterned surface is then covered with metal.

The metal can be deposited by any known technique including vacuum evaporation, sputtering and electroplating. According to preferred aspects of the present invention, a relatively thin layer about 100 to 1000 angstroms, typically about 200 angstroms of chromium or titanium is deposited followed by a layer of copper. The chromium or titanium promotes adhesion between the copper and the dielectric. The total metal layer must be thicker than the depth of the circuit channel. When thick conductor lines (e.g. >10 microns) are required, it is preferred to cover the patterned surface with a thin copper layer (a few microns) and then electroplate to provide the remaining copper thickness.

Next, the metal on the unnecessary areas (i.e.—all areas except in the circuit channels are removed by micromachining. Examples of micromachining are diamond turning, precision grinding, precision polishing and preferably micromilling.

A commercial polishing technique is referred to as chemech polishing. However, since chemech polishing is done by pressing a sample against a soft fabric supported on a rotating disc on which a mixture of abrasive particles and etchant solution is spread, the polishing is conformal. It is difficult to achieve a flat or planar surface particularly when both a polymer and a metal are exposed on the surface. Balancing mechanical and chemical effects to achieve a planar surface is extremely difficult.

According to the preferred aspects of the present invention, a planar surface is achieved by a cutting process with a high precision milling machine. Such machines are commercially available, for example, from Moore and Pneumo in the U.S., CUPE in England and Kugler in West Germany.

These machines generally use single diamond tool bits for machining the workpiece surfaces. However, materials other than single crystal diamonds, such as polycrystal tool bits, tungsten carbide bits can be used.

By leveling the sample mounting stage by laser interferometry, a flatness within 1 micron over 1 meter length can be achieved. The average roughness of the finished surface is 0.02 to 0.005 micron In order to assure removal of the metal from all of the undesired and unnecessary areas, the machining can remove a small depth of the dielectric layer also.

Depending upon the particular structure being fabricated, after the metal on unnecessary area is remove, another photosensitive layer can be deposited and the same procedures are repeated until desired number of layers are achieved.

The flatness or planarity produced by the micromachine techniques is a key factor to the quality and yield improvements of the invented techniques.

In accordance with another aspect of the present invention, a variation of the circuit definition process, a photoresist is provided such as by spinning on a substrate. Typical substrates include metals, plastics, ceramics, glass, glass-ceramics, and ceramics already having circuitry thereon. The preferred substrate are metal or ceramics.

The photoresist can be a negative or positive photoresist including those disclosed hereinabove. The substrate should have at least a substantially planar surface onto which the photoresist is provided in order that subsequent photolithographic processing can be adequately carried out.

The photoresist is then exposed to actinic light such as ultraviolet light radiation in the desired pattern and then developed by employing a suitable solvent to provide a pattern whereby desired circuit channels are subsequently to be provided. The developing solvent in the case of a positive resist removes the exposed photoresist and in the case of a negative resist removes the unexposed photoresist.

Next the entire patterned surface is covered with metal. The metal can be deposited by any known technique including vacuum evaporation, sputtering, electroless plating, sputtering followed by electroplating, and electroless followed by electroplating plating.

According to preferred aspects of the present invention, the metal is copper and is usually about 1 micron to about 50 microns (2 mils) and preferably about 5 microns to about 25 microns thick.

Next, the metal layer is micromachined down to the level of the photoresist thereby exposing the pattern of the remaining photoresist. Any of the micromachining techniques disclosed hereinabove can be employed with micromilling being preferred.

The remaining photoresist is then removed by contacting with a suitable solvent.

A dielectric layer is then deposited on top of the circuit pattern. Any dielectric material can be used including the polyimides and epoxy polymer as disclosed hereinabove and preferably the more conventional non-photosensitive polyimides.

Before dielectric deposition an adhesion promoting layer is applied. Organosilicone compounds can be used for this purpose. A preferred adhesion promotor is A1100 (gamma-amino-propyl-triethoxy-silane) by Union Carbide Co. applied from a solution by an appropriate method, e.g. dipping, spraying, or spinning.

Also, according to preferred aspects of the present invention, the polyimide is fully cured such as by heating to about 300° C. to about 400° C. for about 20 minutes to about 40 minutes.

Next, the dielectric is micromachined down to the level of the metal pattern thereby exposing the metal pattern but maintaining dielectric between metal lines. Any of the micromachining techniques disclosed hereinabove can be employed with micromilling being preferred.

Depending upon the particular structure being fabricated, after the dielectric is removed from the unnecessary areas, another photosensitive layer can be deposited and the same procedures repeated until the desired number of layers are achieved.

According to still another aspect of the present invention, a metallic layer is deposited onto a substrate. Typical substrates include plastics, ceramics, glass and glass-ceramics. The metal can be deposited by any known technique including vacuum evaporation, sputtering and electroplating.

According to preferred aspects of the present invention, a relatively thin layer of about 200 angstroms to about 1000 angstroms, typically about 500 angstroms of chromium or titanium is deposited followed by a layer of copper of about 5° to about 50 microns. The chromium or titanium promoter adhesion between the copper and the substrate.

According to the preferred aspects of the present invention the metal layer can also be provided on a substrate by an economical method such as by laminating a low cost copper film with a thermoplastic polymer such as teflon or an adhesive such as epoxy or acrylate, and micromachined down to provide a desired layer thickness. The advantage of this process is that a number of expensive process steps to deposit a thin metallic layer, such as vacuum evaporation or sputtering, are replaced by a simple lamination process using low cost metal foils.

The metal layer is micromachined down to provide a desired layer thickness such as about 2 microns to about 40 microns, typically about 5 microns.

According to preferred aspects of the present invention, when copper is the metal layer, a thin layer of chromium or titanium of about 100 angstroms to about 1000 angstroms, or typically about 500 angstroms of chromium or titanium, is deposited onto the copper to protect the copper from oxidation and to promote adhesion with subsequently to be applied photoresist.

The chromium can be applied by any known technique such as evaporation and sputtering, after the surface oxide of copper is reduced.

Photoresist is then provided over the metal layer such as by spinning. The photoresist can be a negative or positive photoresist including those disclosed hereinabove. The photoresist is then exposed to actinic light such as ultraviolet light radiation in the desired pattern and then developed by employing a suitable solvent to provide a pattern of the desired metal circuit channel lines to be subsequently provided. The developing solvent in the case of a positive resist removes the exposed photoresist and in the case of a negative resist removes the unexposed photoresist.

Next, the metal exposed upon the removal of the photoresist is removed by etching in known etchants to provide the desired metal pattern using the remaining photoresist as the mask.

For instance, a potassium permanganate composition containing about 60 grams/liter of the permanganate and about 20 grams/liter of sodium hydroxide is sprayed at about 100° F. for about 1.2 minutes at a spray pressure of about 8 psi to remove the chromium. The substrate can then be rinsed in deionized water. A ferric chloride composition of about 1.280 specific gravity is sprayed at about 30° C. for about 1 minute at a pressure of about 8 psi to remove the copper.

The bottom chromium layer can be removed by the same procedure discussed above.

The remaining photoresist is then removed by contacting with a suitable solvent leaving the desired metal pattern.

A dielectric layer is then deposited over the substrate and metallic pattern. Suitable dielectrics include the polyimides and epoxy polymer compositions disclosed hereinabove and preferably the more conventional non-photosensitive polyimides.

Also, according to preferred aspects of the present invention, the polyimide is partially cured such as by heating to about 200° C. to about 400° C. for about 20 minutes to about 60 minutes. The polyimide layer is about 5 microns to about 40 microns thick.

If desired, the remaining dielectric layer can be planarized by micromachining. Any of the micromachining techniques disclosed above can be employed with micromilling being preferred.

Also, according to preferred aspects of the present invention, the polyimide is fully cured such as by heating to about 400° C. for about 30° to about 60 minutes.

Depending upon the particular structure being fabricated, after the above steps, another metal layer can be deposited and the same procedures are repeated until the desired number of layers are achieved.

The following non-limiting examples are provided to further illustrate the present invention:

EXAMPLE 1

64 mm square samples are cut from 1/16" thick copper clad Invar sheets (12.5 Cu/75 Invar/12.5 Cu). The samples are milled about 5 microns from both sides on a Kugler 300/500 A Milling Machine in order to achieve mirror-like surfaces with average roughness less than 1,000 A. Milling is performed by 6 steps, each step cut 1-2 microns.

A thin chromium layer, about 500 A, is sputter deposited on both sides for adhesion enhancement and protection of copper during processing.

A photosensitive epoxy film, about 1 mil thick, is spin coated on the sample from a solution to achieve a 25 microns thick film. The film is dried on a hot plate at about 90° C. for about 10 minutes to remove solvent. The solids content of the epoxy is about 76.1% SU8, about 4.9% XD7342, about 16.6% CY179, about 2.0% UVE1014, and about 0.5% of FC430 in methylethylketone solvent. A circuit pattern which contains 1 mil wide lines and 2 mil vias is defined in the dielectric by exposing through a glass mask with 365nm UV irradiation with an energy about 500 mJ/sq. cm.

After exposure the sample is baked in an oven at about 100° C. for about 15 minutes to promote crosslinking reaction.

The unexposed area is developed by spraying trichloroethane at about 0.6 psi for about 60 seconds. After exposure the sample is cured in an oven at about 175° C. for about 60 minutes.

The patterned surface is deposited with about 2 microns of copper by sputtering. A thin chromium layer is provided under the copper layer for adhesion enhancement. A total 25 microns thick copper layer is prepared by electroplating over the copper layer.

The copper on the surface of dielectric is removed by micromilling using the same machine described above. The milling process is done in 5 steps each step removing 5 microns.

A well-defined circuit pattern embedded in dielectric is achieved. The surface is flat and smooth and more than appropriate for the next layer to be built. Multilayer structures are achieved by repeating the above described process steps.

EXAMPLE 2

About 20 microns thick resist layer are coated on the chromium coated metal substrate described in example 1 by spinning Armstrong Fanton F362 negative photoresist.

This resist is chosen because of the toughness of the crosslinked layer. Many negative resists tend to be brittle after they are crosslinked.

The resist film is baked to remove solvent on a hot plate at 100° C. for 10 minutes.

After baking a circuit pattern which contains 1 mil wide lines and 2 mil vias is defined in the resist layer by exposing through a glass mask with 365nm UV irradiation with an energy about 175 mJ/sq. cm.

The unexposed area is developed by spraying an aqueous solution of about 1.0 weight percent sodium carbonate at about 20 psi. A belt type continuous spray etcher is employed at a speed of about 1.2 meter/minute. After development, the sample is baked in a 100° C. oven for about 10 minutes.

About 35 microns thick copper layer is deposited on the patterned side of the sample by repeating the same procedures described in the example 1. The copper on the top of the resist is removed with the same milling machine in 10 steps. Each step removed about 3.5 microns of copper. After the resist surface is revealed, the resist film between circuit lines is stripped with about 1-2% potassium hydroxide solution. Well-defined and nearly rectangular circuit lines are realized on the substrate.

A PMDA-ODA type polyamic acid, DuPont RC5878, is coated on the patterned substrate by multiple spinning to achieve 15 microns of thickness. The polyimide film is dried on a hot plate at about 120° C. for about 30 minutes. The dried film is cured in a nitrogen purged oven according to a predetermined temperature cycle. Final cure is done by holding the temperature at about 360° C. for about 30 minutes.

About 10 microns of polyimide and copper are removed by milling in 5 steps. Each step removes about 2 microns of materials. The final result is a copper circuitry about 8 microns thick embedded in a polyimide layer with the same thickness. The surface is flat and well-defined and ready for another layer to be built. Multilayer structures are prepared by repeating the same procedures.

What is claimed is:

1. A process for forming a metallic pattern on a substrate for the fabrication of thin film structures for multichip packaging which comprises:
    a. providing on a substrate a dielectric layer;
    b. defining desired pattern of circuit channels in said dielectric layer;
    c. depositing metal onto the dielectric layer and in the circuit channels; and then
    d. micromachining the metal to thereby remove metal from above the dielectric while leaving metal deposited in the circuit channels to thereby provide said metallic pattern on said substrate; wherein said micromachining is single crystal diamond cutting to provide planar metallic pattern in which the flatness is within 1 micron over 1 meter length and the average roughness of the metallic pattern is 0.02 to 0.005 micron.

2. The process of claim 1 wherein said dielectric layer is a photosensitive polyimide precursor layer.

3. The process of claim 1 wherein said dielectric layer is a photosensitive epoxy polymer layer.

4. The process of claim 1 wherein the circuit channels are defined by imagewise exposing the dielectric to actinic light; then developing thereby providing the circuit channels.

5. The process of claim 4 wherein the dielectric remaining after the developing is cured.

6. The process of claim 1 wherein the metal includes copper.

7. The process of claim 1 wherein the circuit channels are at least 10 microns thick.

8. The process of claim 1 wherein said dielectric layer is a non-photosensitive polyimide precursor layer.

9. The process of claim 8 wherein the circuit channels are defined by depositing a photosensitive layer on said dielectric layer, imagewise exposing the photosensitive layer to actinic light, developing the photosensitive layer to provide a mask of the desired pattern of circuit channels, and then defining the desired pattern of circuit channels in the dielectric layer using the developed photosensitive layer as the mask.

10. The process of claim 9 which further includes providing a metal layer intermediate said photosensitive layer and said dielectric, etching said metal layer using the developed photoresist as a mask and then defining the desired pattern of circuit channels in the dielectric layer using both the developed photosensitive layer and etched metal layer as the mask.

11. The process of claim 1 wherein the metal includes copper.

12. The process of claim 8 wherein the circuit channels are defined in the dielectric layer by an ablation technique.

13. The process of claim 12 wherein said ablation technique is reactive ion etching.

14. The process of claim 13 wherein a layer resistant to reactive ion etching is provided on the dielectric layer over those areas where a circuit pattern is not desired.

15. The process of claim 14 wherein said layer resistant reactive ion etching is a metal or metal oxide.

16. The process of claim 1 wherein the circuit channels are at least 10 microns thick.

17. The process of claim 1 wherein said metallic pattern is about 1 to about 50 microns thick.

18. The process of claim 1 wherein said metallic pattern is about 5 to about 25 microns thick.

19. A process for forming a metallic pattern on a substrate for the fabrication of thin film structure for multichip packaging which comprises:
   a. providing on a substrate a photosensitive layer;
   b. defining desired pattern of circuit channels in said photosensitive layer;
   c. depositing metal onto the photosensitive layer and in the circuit channels;
   d. micromachining the metal to thereby remove metal from above the photosensitive layer while leaving metal deposited in the circuit channels defined by the photosensitive layer;
   e. removing the remaining photosensitive layer;
   f. depositing a dielectric layer onto the metal and over the substrate;
   g. micromachining the dielectric layer down to the level of the metal to remove the dielectric from above the metal while leaving dielectric in the spaces between the metal; wherein said micromachining in steps d. and g. is single crystal diamond cutting to provide planar metallic pattern in which the flatness is within 1 micron over 1 meter length and the average roughness of the metallic pattern is 0.02 to 0.005 micron.

20. The process of claim 19 wherein said dielectric layer is a polyimide precursor layer.

21. The process of claim 19 wherein the metal includes copper.

22. The process of claim 19 wherein the circuit channels are at least 10 microns thick.

23. The process of claim 19 wherein said metallic pattern is about 1 to about 50 microns thick.

24. The process of claim 19 wherein said metallic pattern is about 5 to about 25 microns thick.

* * * * *